United States Patent [19]

Furihata

[11] Patent Number: 4,509,036
[45] Date of Patent: Apr. 2, 1985

[54] A/D CONVERTER WITH BIT EXTENSION CAPABILITY USING WIRED-OR OUTPUTS

[75] Inventor: Makoto Furihata, Tachikawa, Japan

[73] Assignee: Hitachi, Ltd., Tokyo, Japan

[21] Appl. No.: 292,587

[22] Filed: Aug. 13, 1981

[30] Foreign Application Priority Data

Aug. 13, 1980 [JP] Japan .................. 55-110231
Aug. 13, 1980 [JP] Japan .................. 55-110232

[51] Int. Cl.³ .......................................... H03K 13/02
[52] U.S. Cl. ............................ 340/347 AD; 340/347 M
[58] Field of Search ..... 340/347 M, 347 AD, 347 CC

[56] References Cited

U.S. PATENT DOCUMENTS 3,829,853 8/1974 Freedman .................. 340/347 AD

OTHER PUBLICATIONS

Schmid, Electronic Analog/Digital Conversions, Van Nostrand Reinhold Co., 1970, pp. 343–348.
Pressman, Design of Transistorized Circuits for Digital Computers, John F. Rider, Inc., 1959, pp. 1–6 & 1–7.
Glincman, CMOS/MOS Flash ADC Speeds on Low Power for Low Cost, Electronic Design, 11/1980, pp. 227–231.

Primary Examiner—T. J. Sloyan
Attorney, Agent, or Firm—Antonelli, Terry & Wands

[57] ABSTRACT

A parallel comparator includes a plurality of comparator portions each having first and second transistors differentially connected. The first transistors have their bases connected to receive an analog input signal, whereas the second transistors have their bases connected to receive reference voltages having different levels. Among the plural comparator portions, the collector of the first transistor and the collector of the second transistor are connected with a load in accordance to a predetermined rule. An A/D converter for converting an analog input signal into digital signals of plural codes is also provided which includes a critical detecting comparator for generating a detection output at a predetermined level when the digital signals of the plural codes are converted into such an analog signal as effects the overflow or underflow. The A/D converter includes a control circuit for forcibly controlling the levels of the digital signals of the plural bits in case the detection output of the critical detecting comparator reaches a predetermined level.

7 Claims, 14 Drawing Figures

A/D CONVERTER WITH BIT EXTENSION CAPABILITY USING WIRED-OR OUTPUTS

BACKGROUND OF THE INVENTION

The present invention relates to a parallel comparator and an A/D converter.

Such a circuit as is shown in FIG. 1 is examined as a parallel comparator to be used in an A/D converter by the Inventor. This circuit is made into a two-stage differential amplifier so as to steepen the switching characteristics, i.e., to increase the gain.

Therefore, that circuit has defects that the number of circuit constituting elements is large and that the power consumption is increased.

Moreover, since comparator outputs $OUT_1$ to $OUT_3$ respectively vary with reference to reference voltages $V_1$ to $V_3$, there arises another defect in that the logic circuit construction in the case of conversion into digital signals of binary code is complicated.

Since the A/D converter constructed as a monolithic or hybrid IC has its circuit construction fixed, it is convenient to extend the output bits.

SUMMARY OF THE INVENTION

It is an object of a first invention to provide a parallel comparator which can attain a high gain and reduce the power consumption with the use of a simple circuit construction.

Another object of the first invention is to provide a parallel comparator which is suitable for fabrication of a monolithic IC.

Still another object of the first invention is to provide a parallel comparator which can realize a high-speed operation.

A further object of the first invention is to provide a parallel comparator which can facilitates conversion into a digital signal of predetermined code.

An object of a second invention is to provide an A/D converter which can facilitate extension of output bits Another object of the second invention is to provide an A/D converter which is suitable for fabrication of an integrated circuit.

Still another object of the second invention is to provide an output extending system for the A/D converter, which has its circuit simplified.

A further object of the second invention is to provide an A/D converter, which can realize a high-speed operation, and an output extending system therefor.

The first invention is directed to a comparator which is constructed of differential transistor circuit. The collectors of differential transistors at an nth (wherein n designates 1, 2, 3, - - -, n) comparator portion for generating one output and the collectors of diffential transistors at an (n+x)th (wherein x designates a positive integer) comparator portion for generating the other output are commonly connected with load means so that a window type comparator is constructed.

The second invention is directed to an A/D converter which is constructed as an integrated circuit device. That A/D converter is additionally provided with both an underflow or overflow detection output function and a function to forcibly fix a digital output signal at a predetermined level in accordance with an underflow signal or an external signal. In order to extend the number of the output bits, on the other hand, the underflow or overflow signal to be fed out is utilized as an extension output bit signal.

DESCRIPTION OF THE PREFERRED EMBODIMENTS

The present invention will now be described in detail in connection with the embodiments thereof.

Figure 2:
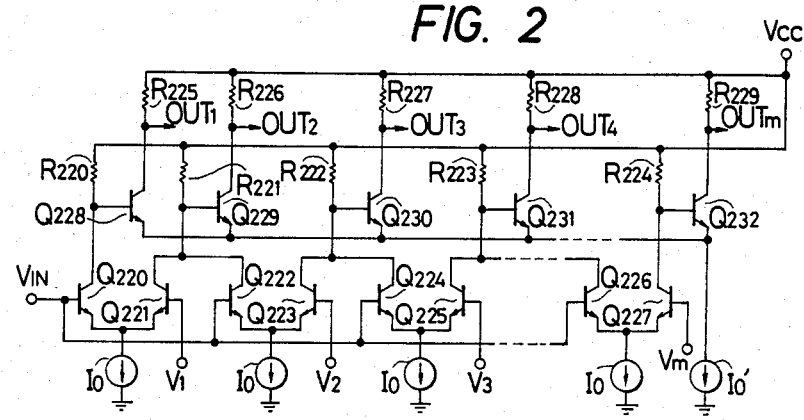
FIG. 2 is a diagram showing a circuit according to one embodiment of the present invention.

FIG. 2 is a circuit diagram showing one embodiment of the present invention.

This circuit is constructed of a plurality of basic differential transistor circuits which include paired differential transistors $Q_{220}$, $Q_{221}$ to $Q_{226}$, and $Q_{227}$, and constant voltage sources $I_0$ connected with their respective common emitters. The differential transistors $Q_{220}$ to $Q_{226}$ indicated at even numbers have their bases commonly fed with an analog voltage signal $V_{IN}$, whereas the other differential transistors $Q_{221}$ to $Q_{227}$ indicated at odd numbers have their bases respectively fed with reference voltages $V_1$ to $V_m$ ($V_1 < V_2 < V_3 - - - < V_m$).

Moreover, in the order which is started from the comparator portions fed with the lower reference voltage $V_1$, the collectors of the adjoining differential transistors are commonly connected with each other and with a plurality of load resistors. Specifically, the collector of the other differential transistor $Q_{221}$ at the first comparator portion and the collector of the one differential transistor $Q_{222}$ at the second comparator portion are commonly connected with each other and with a load resistor $R_{221}$. The collector of the other differential transistor $Q_{223}$ at the second comparator portion and the collector of the one differential transistor $Q_{224}$ at the third comparator are commonly connected with each other and with a load resistor $R_{222}$. Generally speaking, the collector of the other differential transistor at the nth comparator portion and the collector of the one differential transistor at the (n+1)th comparator portion are commonly connected with each other and with a load resistor.

Moreover, the collectors of the one differential transistor $Q_{220}$ at the lowest comparator portion and of the other differential transistor $Q_{227}$ at the highest comparator portion are commonly connected not with the collector of any transistor but with load resistors $R_{220}$ and $R_{224}$, respectively.

The outputs of the comparator constructed of the aforementioned respective load resistors $R_{220}$ to $R_{224}$ are impressed upon the bases of amplifying transistors $Q_{228}$ to $Q_{232}$. The emitters of those transistors $Q_{228}$ to $Q_{232}$ are commonly connected with one another and with a constant current source $I_0'$. Moreover, the collectors of those transistors $Q_{228}$ to $Q_{232}$ are connected with load resistors $R_{225}$ to $R_{229}$, respectively, thereby to generate outputs $OUT_1$ to $OUT_m$.

Figure 3:
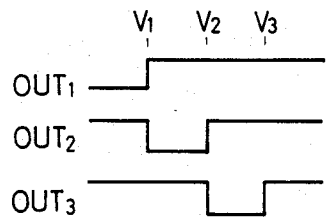
FIG. 3 is a chart showing the waveforms for explaining the operations of the embodiment of FIG. 2.

The operations of this embodiment circuit will be described with reference to the operation waveform chart of FIG. 3.

When the analog voltage signal $V_{IN}$ is smaller $V_1$, the transistors $Q_{220}$, $Q_{222}$, $Q_{224}$ and $Q_{226}$ are rendered non-conductive, whereas the transistors $Q_{221}$, $Q_{223}$, $Q_{225}$ and $Q_{226}$ are rendered conductive. As a result, only the amplifying transistor $Q_{228}$ is rendered conductive so that only the output $OUT_1$ generated through that transistor is at a low level.

Next, for $V_1 < V_{IN} < V_2$, the transistor $Q_{221}$ is rendered non-conductive because of $V_1 < V_{IN}$, whereas the transistor $Q_{222}$ is rendered non-conductive because of $V_{IN} < V_2$. As a result, a high level is generated from the commonly connected collectors of the transistors $Q_{221}$ and $Q_{222}$, and only the output $OUT_2$ generated through the amplifying transistor $Q_{229}$ is at the low level.

Subsequently, only the output $OUT_3$ is at the low level in a similar manner for $V_2 < V_{IN} < V_3$.

Since the aforementioned outputs $OUT_1$ to $OUT_m$ consecutively take the low level so that they can be made substantially equal to a decimal code, the conversion into the decimal code or binary code can be accomplished remarkably simply.

On the other hand, the amplifying transistors $Q_{228}$ to $Q_{232}$ substantially operate as differential transistors. More specifically, when the amplifying transistor $Q_{229}$, for example, is changed from non-conductive to conductive state, the amplifying transistor $Q_{228}$ is changed from conductive to non-conductive state. Thus, only one of the amplifying transistors is rendered conductive.

Figure 1:
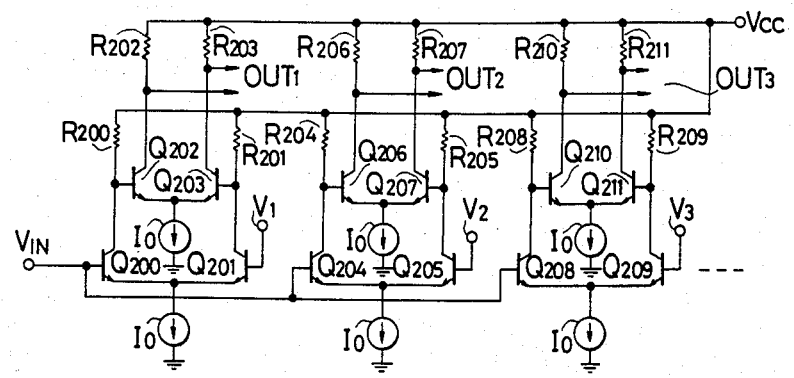
FIG. 1 is a diagram of the circuit which has been examined by the inventor prior to the present invention.

As a result, the embodiment circuit shown in FIG. 2 can attain the same high gain as that of the two-stage differential amplifying circuit of FIG. 1.

Moreover, the embodiment circuit thus far described can remarkably reduce the number of the resistors and the transistors and the power consumption as a result that the differential transistors constructing the comparator portions are commonly connected with each other and with the load resistors, that the amplifying transistors perform the differential amplifications with the use of the other comparator outputs, and that the amplifying transistors commonly use the single constant current source.

In the transistors constructing the comparator portions, on the other hand, a pair of transistors having their collectors commonly connected can be formed in an identical device forming region (i.e., a well region) so that the size of the chip can be reduced upon fabrication of a monolithic IC.

Figure 4:
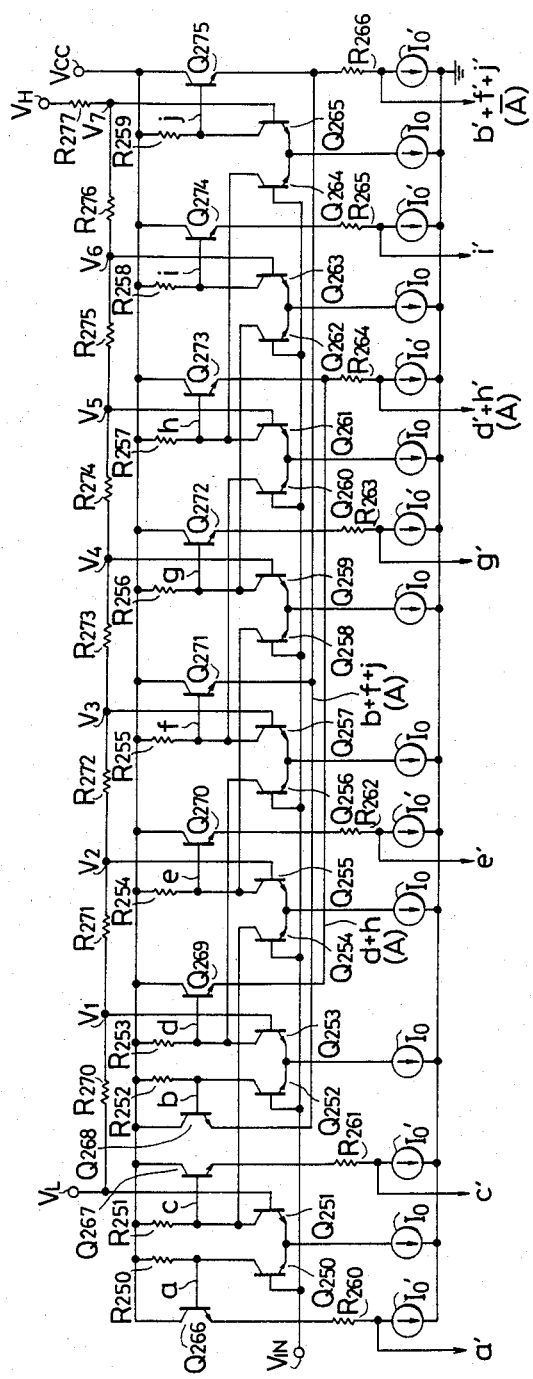
FIG. 4 is a diagram showing a circuit according to another embodiment of the present invention.

FIG. 4 is a circuit diagram showing another embodiment of the present invention.

This embodiment circuit constructs two comparator groups such that the order of commonly connecting the collectors of the differential transistors constructing comparator portions is made to occur between every other comparators.

More specifically, there are arranged eight differential transistor circuits which include paired differential transistors $Q_{250}$, $Q_{251}$ to $Q_{264}$, and $Q_{265}$, and the constant current sources $I_0$ connected with the common emitters thereof. Similarly to the foregoing embodiment, the differential transistors $Q_{250}$ to $Q_{264}$ indicated at even numbers have their bases commonly fed with the analog voltage signal $V_{IN}$, whereas the other transistors $Q_{253}$ to $Q_{265}$ indicated at odd numbers have their bases consecutively fed with the reference voltages $V_1$ to $V_7$ (wherein $V_1 < V_2 < V_3 --- < V_7$) which are prepared by voltage dividing resistors $R_{270}$ to $R_{277}$, and the differential transistor $Q_{251}$ has its base fed with the lowest voltage $V_L$ for underflow detection.

Moreover, in the order of the comparator portions which are fed with the lower reference voltage $V_L$ and the reference voltage $V_1$, the collectors of the alternately adjacent differential transistors are commonly connected with each other and with the load resistor.

More specifically, the collector of the other differential transistor $Q_{251}$ at the first comparator portion and the collector of the one differential transistor at the third comparator portion are commonly connected with each other and with the load resistor $R_{251}$. Moreover, the collector of the other differential transistor $Q_{255}$ at that third comparator portion and the collector of the one differential transistor $Q_{258}$ at the fifth comparator portion are commonly connected with each other and with a load resistor $R_{254}$. Thus, the collectors are commonly connected between the comparator portions of the odd orders, and the collectors are likewise similarly connected between the comparator portions of the even orders from the second comparator portion.

In the first comparator group having its collectors commonly connected between the comparator portions of the odd orders and the second comparator group having its collectors commonly connected between the comparator portions of the even orders, as has been described in the above, load resistors $R_{250}$, $R_{252}$, $R_{258}$ and $R_{259}$ are connected, respectively, with the differential transistors $Q_{250}$ and $Q_{252}$ at the lowest comparator portions of the respective groups, i.e., the first and second comparator portions and with the other differential transistors $Q_{263}$ and $Q_{265}$ at the highest comparator portions, i.e., the seventh and eighth comparator portions.

The outputs a to j of the aforementioned respective comparator portions are fed out through emitter-follower transistors $Q_{266}$ to $Q_{275}$, respectively. Of these, in order to prepare the lowest bit signals A and $\overline{A}$ of gray code, the emitters of the transistors $Q_{269}$ and $Q_{273}$ and the emitters of the transistors $Q_{268}$, $Q_{271}$ and $Q_{275}$ are commonly connected with each other and with a resistor $R_{264}$ and a constant current source $I_0'$, and a resistor $R_{266}$ and a constant current source $I_0'$, respectively, which construct level shift circuits.

On the other hand, the emitter of the other transistor $Q_{266}$ or the like is connected with a resistor $R_{260}$ and the constant current circuit which likewise construct a level shift circuit.

The operations of the embodiment circuit thus far described will be explained in detail with reference to the operation waveform chart of FIG. 5.

The transistor $Q_{250}$ is rendered non-conductive for $V_{IN} < V_L$ thereby to raise the collector output a to the high level. The transistor $Q_{252}$ is rendered non-conductive for $V_{IN} < V_1$ thereby to raise the collector output b to the high level.

On the other hand, the transistor $Q_{263}$ is rendered non-conductive for $V_{IN} > V_6$ thereby to raise the collector output i to the high level.

The transistor $Q_{265}$ is rendered non-conductive for for $V_{IN} > V_7$ thereby to raise the collector output j to the high level.

Moreover, the outputs c to h, which are prepared by making the collectors common among the alternate comparator portions, are at the high level only in case the paired transistors having their collectors commonly connected are non-conductive together. Specifically, the output c is at the high level only for $V_L < V_{IN} < V_2$ when the transistors $Q_{251}$ and $Q_{254}$ are rendered non-conductive together. The output d is at the high level only for $V_1 < V_{IN} < V_3$ when the transistors $Q_{253}$ and $Q_{256}$ are rendered nonconductive together. Likewise, the output e is at the high level only for $V_2 < V_{IN} < V_4$; the output f is at the high level only for $V_3 < V_{IN} < V_5$; the output g is at the high level only for $V_4 < V_{IN} < V_6$; and the output H is at the high level only for $V_5 < V_{IN} < V_7$.

Moreover, this embodiment circuit uses the diode OR circuit which makes use of the bases and emitters of the emitter-follower transistors. The inversed lowest bit signal $\overline{A}$ of gray code can be prepared by taking the logical sum $b+f+j$ of the outputs b, f and j, and the lowest bit signal A of gray code can be prepared by taking the logical sum $d+d$ of the outputs d and h.

Incidentally, the other bit signals B, C and so on of gray code can be prepared by similarly taking the logical sums $e+g$ and $g+j$. In order to generate the respective inverted outputs $\overline{B}$ and $\overline{C}$, however, it is necessary to take the logical sums $c+i$ and $c+e$ thereby to invite a danger that the outputs e and i are doubly used. In order to avoid that danger, according to the embodiment, the level-shifted signals c' to i' are prepared by means of diode OR circuits (although not shown).

Incidentally, if the aforementioned double signals e and i are prepared through a multi-emitter transistor, the other gray code signals B, $\overline{B}$, C and $\overline{C}$ can be generated similarly to the gray code signals A and $\overline{A}$.

Although not shown in the embodiment, moreover, the aforementioned code signals A and $\overline{A}$, B and $\overline{B}$, and C and $\overline{C}$ of opposite phases are fed to and amplified by the differential amplifying circuit thereby to realize the high gain.

In case the collectors are connected between the alternate comparators, as in the embodiment circuit, the switching operation of the differential transistors is performed by using the higher and lower ones of a reference voltage as border lines. As a result, a higher-speed operation can be realized than that of the embodiment circuit shown in FIG. 2. In other words, the frequency characteristics can be enlarged two times. Moreover, the allowability of the comparator for the dispersion in an input threshold can be enlarged.

As has been described in the above, still moreover, in case the digital signal of gray code is to be prepared, the lowest bit signal can be directly generated.

Incidentally, it is possible to simplify the circuit, to reduce the power consumption and to reduce the size of the chip for fabrication of the monolithic IC by making the collectors common and by providing the differential amplifier after the gray coding.

Figure 5:
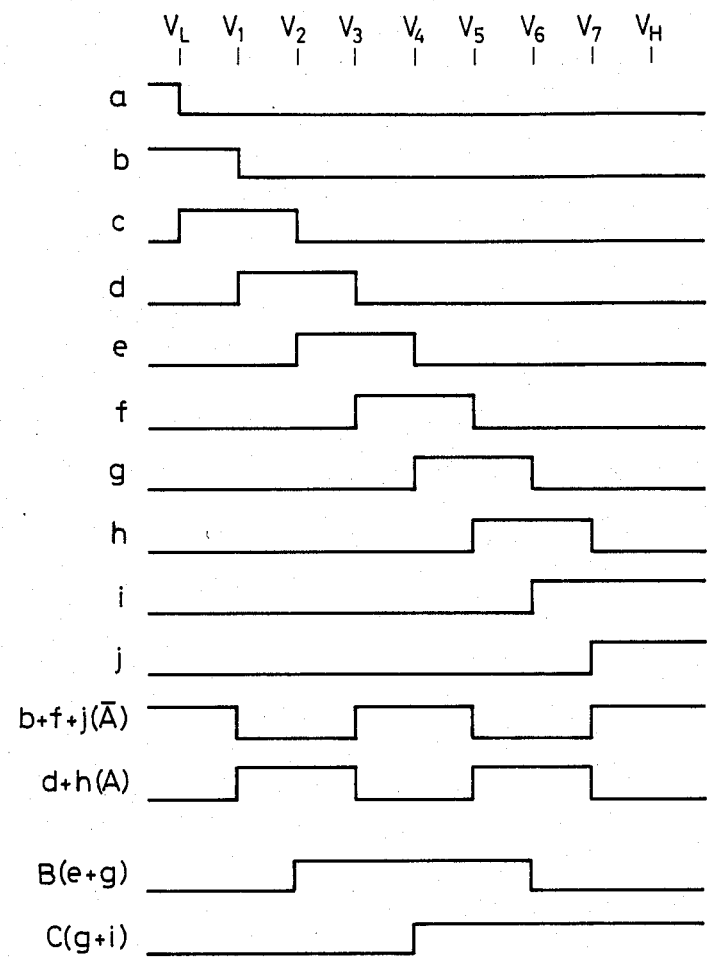
FIG. 5 is a chart showing the waveforms for explaining the operations of the embodiment of FIG. 4.

Incidentally, it is presumed that the embodiment circuit could be made merely by changing the order of the comparators having their collectors commonly connected partly because the lowest bit signals A and $\overline{A}$ of gray code can be directly prepared and partly because the gray code signal B, for example, is sufficient to be at the high level for $V_2 < V_{IN} < V_6$, as viewed from the operation waveform chart of FIG. 5.

Next, the parallel comparator, which can directly generate the gray code signal in view of the aforementioned fact, and an A/D converter making use of that comparator will be described in detail in the following.

Figure 6A:
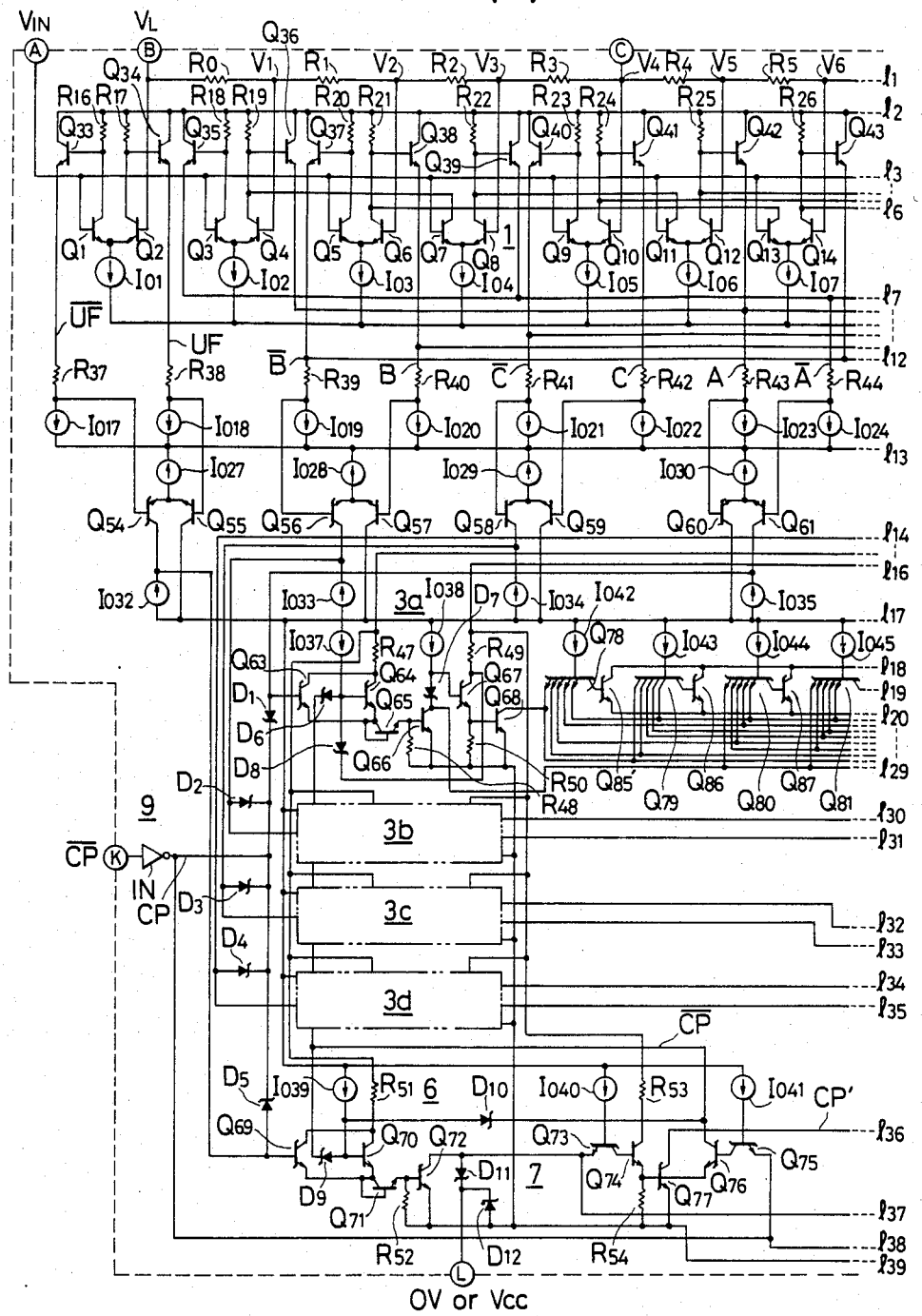
FIGS. 6(A) and 6(B) are a circuit diagram showing an A/D converter according to still another embodiment of the present invention.
Figure 6B:
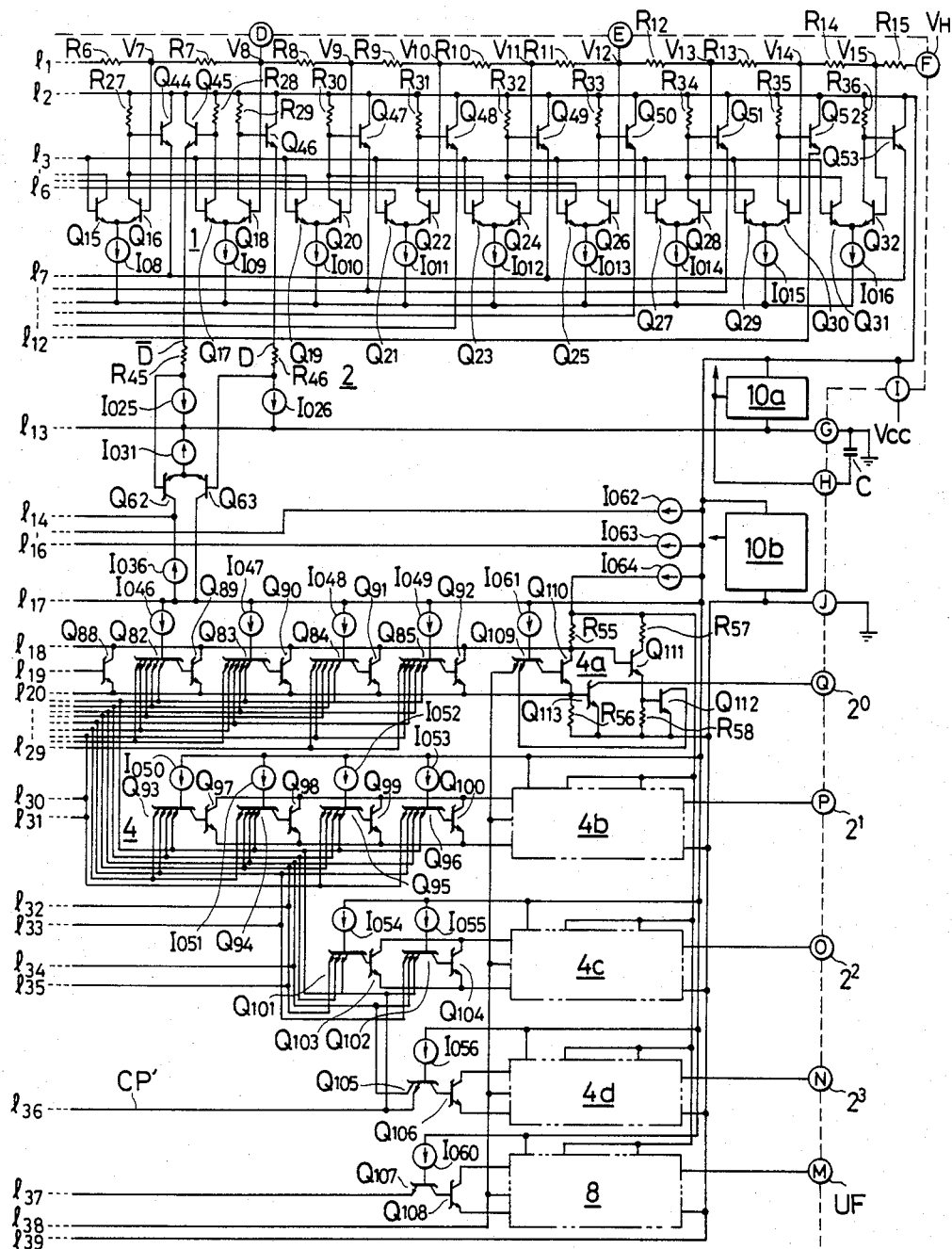

FIGS. 6(A) and 6(B) are a concrete circuit diagram showing a four-bit A/D converter according to one embodiment of the present invention, and parts enclosed by broken lines IC are formed in the monolithic IC.

Resistors $R_0$ to $R_{15}$, which are connected in series between the terminals B and F, divide the lowest voltage $V_L$ and the highest $V_H$ each one sixteenth thereby to prepare the reference voltages $V_1$ to $V_{15}$ for the fifteen comparators.

Paired differential transistors $Q_3$, $Q_4$ to $Q_{31}$ and $Q_{32}$ construct a comparator 1 together. The transistors $Q_4$ to $Q_{32}$ indicated at the even numbers have their bases fed with the reference voltages $V_1$ to $V_{15}$ ($V_1 < V_2 < V_3 < \cdots < V_{15}$), respectively, which are prepared by the aforementioned resistors $R_0$ to $R_{15}$, whereas the transistors $Q_3$ to $Q_{31}$ indicated at the odd numbers have their bases fed with the analog voltage signal $V_{IN}$ coming from the terminal A.

The transistor $Q_2$ having its base fed with the lowest voltage $V_L$ and the transistor $Q_1$ having its base fed with the analog voltage signal $V_{IN}$ construct together the comparator which is provided for the underflow detection.

The collectors of the paired differential transistors constructing the aforementioned fifteen parallel comparators are connected to construct three kinds of window type comparators so as to prepare the digital signals A to C of the gray code.

In order to prepare the lowest bit signals A and $\overline{A}$ of the gray code, more specifically, the collectors of the comparator portions of the alternate orders from the lowest comparator portions $Q_3$ and $Q_4$ are commonly connected with each other and with collector resistors $R_{19}$, $R_{22}$, $R_{25}$, $R_{27}$, $R_{30}$, $R_{32}$ and $R_{34}$, respectively. The collectors of the transistors $Q_3$ and $Q_{32}$ left uncommon are connected with collector resistors $R_{18}$ and $R_{36}$.

The collector voltage of the transistors $Q_4$ and $Q_7$ made common is at the high level only for $V_1 < V_{IN} < V_3$ because the transistors $Q_4$ and $Q_7$ are rendered non-conductive together. The collector voltage of the next transistors $Q_8$ and $Q_{11}$ made common is at the high level only for $V_3 < V_{IN} < V_5$ because the transistors $Q_8$ and $Q_{11}$ are rendered non-conductive together. Likewise, the collector voltage of the subsequent transistors made common is consecutively at the high level as the analog voltage is successively raised.

On the other hand, the collector voltage of the aforementioned transistor $Q_3$ is at the high level only for $V_1 > V_{IN}$ because the transistor $Q_3$ is rendered nonconductive, whereas the collector voltage of the transistor $Q_{32}$ is at the high level only for $V_{15} < V_{IN}$ because the transistor $Q_{32}$ is rendered non-conductive.

Figure 7:
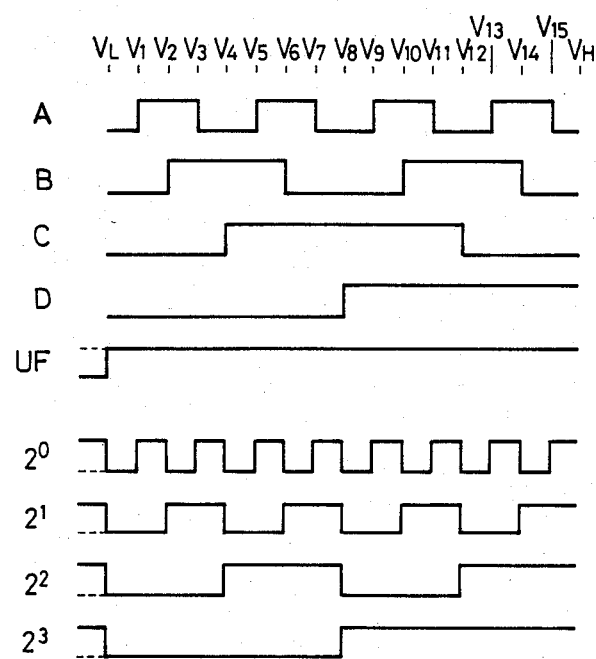
FIG. 7 is a waveform chart for explaining the operations of the embodiment of FIGS. 6(A) and 6(B)

As a result, of the collector voltages made common, the alternate collector voltages of the transistors $Q_4$ and $Q_7$, and $Q_{12}$ and $Q_{15}$ become equal to the lowest bit signals A and $\overline{A}$ fo gray code, as shown in FIG. 7.

As a result, the gray code signal A can be prepared by making common through emitter-follower transistors $Q_{36}$, $Q_{42}$, $Q_{47}$ and $Q_{51}$, in other words, by effecting passage through the diode OR circuit making use of the bases and emitters of the transistors.

On the other hand, the alternate collector voltages of the transistors $Q_8$ and $Q_{11}$, and $Q_{16}$ and $Q_{19}$ made common, while including the collector voltages of the aforementioned transistors $Q_3$ and $Q_{32}$, are at the high level when the aforementioned gray code signal A is at the low level. As a result, by making the emitter-follower transistors $Q_{35}$, $Q_{39}$, $Q_{44}$, $Q_{49}$ and $Q_{53}$ common, the logic sum output similar to the aforementioned one is generated to produce the inverted gray code signal $\overline{A}$.

In order to prepare the second bit signals B and $\overline{B}$ of gray code, on the other hand, the collectors of the comparator portions of every fourth order from the second comparator portions $Q_5$ and $Q_6$ are commonly connected with each other and with collector resistors $R_{21}$, $R_{26}$ and $R_{31}$, respectively.

The collectors of the transistors $Q_5$ and $Q_{30}$ left uncommon at both ends are connected with collector resistors $R_{20}$ and $R_{35}$, respectively.

The collector voltage of the transistors $Q_6$ and $Q_{13}$ made common is at the high level only for $V_2 < V_{IN} < V_6$ because the transistors $Q_6$ and $Q_{13}$ are rendered non-conductive together. The collector voltage of the next transistors $Q_{14}$ and $Q_{21}$ made common is at the high level only for $V_6 < V_{IN} < V_{10}$ because the transistors $Q_{14}$ and $Q_{21}$ are rendered non-conductive together. Moreover, the collector voltage of the next transistors $Q_{22}$ and $Q_{29}$ made common is at the high level only for $V_{10} < V_{IN} < V_{14}$ because the transistors $Q_{22}$ and $Q_{29}$ are rendered non-conductive together.

On the other hand, the collector voltages of the transistors $Q_5$ and $Q_{30}$ at both ends are at the high level only for $V_2 > V_{IN}$ and for $V_{14} < V_{IN}$, respectively, because the transistors $Q_5$ and $Q_{30}$ are rendered non-conductive, respectively.

As a result, in the collector coltages made common, the alternate collector voltages of the transistors $Q_6$ and $Q_{13}$, and $Q_{22}$ and $Q_{29}$ become equal to the second bit signal B of gray code, as shown in FIG. 7.

As a result, by making common through emitter-follower transistors $Q_{38}$ and $Q_{48}$, the logic OR output similar to the aforementioned one is generated to prepare the gray code signal B.

On the other hand, both the collector voltages of the aforementioned transistors $Q_5$ and $Q_{30}$ at both the ends and the collector voltage of the transistors $Q_{14}$ and $Q_{21}$ made common are at the high level when the aforementioned gray code signal B is at the low level. As a result, by making common through emitter-follower transistors $Q_{37}$, $Q_{43}$ and $Q_{52}$, the logic sum output similar to the aforementioned one is generated to prepare the inverted gray code signal $\overline{B}$.

In order to prepare the third bit signal C of gray code, moreover, in view of the comparator portions $Q_{25}$ and $Q_{26}$ at intervals of 7 from the fourth comparator portions $Q_9$ and $Q_{10}$, the collectors of the transistors $Q_{10}$ and $Q_{25}$ are commonly connected with each other and with a collector resistor $R_{24}$, whereas the collectors of the transistors $Q_9$ and $Q_{26}$ at both the ends are connected with collector resistors $R_{23}$ and $R_{33}$, respectively.

The collector voltage of the transistors $Q_{10}$ and $Q_{25}$ made common is at the high level only for $V_4 < V_{IN} < V_{12}$ because the transistors $Q_{10}$ and $Q_{25}$ are rendered non-conductive together. As a result, the gray code signal C, as shown in FIG. 7, can be prepared.

On the other hand, the collector voltages of the transistors $Q_9$ and $Q_{26}$ at both the ends are at the high level only for $V_4 > V_{IN}$ and for $V_{12} < V_{IN}$, respectively, because the transistors $Q_9$ and $Q_{26}$ are rendered non-conductive, respectively. As a result, by making common through emitter-follower transistors $Q_{40}$ and $Q_{50}$, the logic sum output similar to the aforementioned one is generated to prepare the inverted gray code signal $\overline{C}$.

Moreover, at the outputs of the comparator portions $Q_{17}$ and $Q_{18}$ using the intermediate voltage $V_8$ as the reference voltage, there can be directly generated the highest bit signals D and $\overline{D}$ of gray code, as shown in FIG. 7.

On the other hand, the comparator portions $Q_1$ and $Q_2$ prepare the underflow signals UF and $\overline{UF}$ for detecting the inequality of $V_L > V_{IN}$.

Those gray code signals A to C and $\overline{A}$ to $\overline{C}$ and underflow signals UF and $\overline{UF}$ are subjected to level conversions by emitter-follower transistors $Q_{33}$ to $Q_{53}$, resistors $R_{37}$ to $R_{46}$ and constant current circuits $I_{017}$ to $I_{026}$ and are amplified to the TTL level signals by the actions of differential amplifying transistor circuits $Q_{54}$, $Q_{55}$ to $Q_{62}$, and $Q_{63}$.

A master latch circuit 3a made receptive of the gray code signal A is constructed of: the input transistor $Q_{63}$; a feedback input transistor $Q_{64}$; the resistor $R_{47}$ connected with the commonly connected collectors of the transistors $Q_{63}$ and $Q_{64}$; a transistor $Q_{65}$ of diode connection connected with the commonly connected emitters of the transistors $Q_{63}$ and $Q_{64}$ to effect the level shifts; an emitter load resistor $R_{48}$; a transistor $Q_{66}$ having its base fed with the input signal through that level shift transistor; a Shottky barrier diode $D_7$ (which will be referred to merely as a "diode") and a constant current load circuit $I_{038}$ connected with that collector; a transistor $Q_{67}$ made receptive of the output of the former; a collector load resistor $R_{49}$ and an emitter load resistor $R_{50}$ therefor; a transistor $Q_{68}$ having its base fed with the emitter output of the former; a diode $D_8$ for feeding back the collector output to the base of the aforementioned feedback input transistor $Q_{64}$; a diode $D_1$ connected with the base of the aforementioned input transistor $Q_{63}$ and constructing the gate circuit; and a diode $D_6$ and a constant current circuit $I_{037}$ connected with the base of the aforementioned feedback input transistor $Q_{64}$ and constructing the gate circuit. Master latch circuits 3b to 3d, which are made receptive of the other gray code signals B to D, are constructed of a similar circuit.

On the other hand, a master latch circuit 6, which is made receptive of the underflow signal UF, is constructed, too, of a basically similar circuit to the aforementioned latch circuit 3a.

The difference inbetween resides in that the diodes $D_{11}$ and $D_{12}$ constructing a gate circuit 7 are connected with the collector of a transistor $Q_{72}$ constructing the inverter circuit of the previous stage, and in that TTL transistors $Q_{75}$ and $Q_{76}$ constructing the gate circuit 7 and having their inputs fed with clock pulses CP are connected with a transistor $Q_{74}$ constructing of the inverter circuit of the subsequent stage.

The commonly connected cathode electrode of the diodes $D_{11}$ and $D_{12}$ constructing the aforementioned gate circuit 7 is connected with an external terminal L so that it is selectively fed with a voltage at 0 V or $V_{CC}$.

A waveform shaping circuit 9 is constructed of an inverter circuit IN to prepare the clock pulses CP, which are inverted from the clock pulses $\overline{CP}$ fed from an external terminal K, and to impress the clock pulses CP upon the commonly connected cathode electrode of the diodes $D_1$ to $D_5$ which are connected with the bases of the input transistors of the latch circuits and which construct the gate circuit. Moreover, the circuit 9 impresses the clock pulses $\overline{CP}$, which are inverted through the TTL transistors $Q_{75}$ and $Q_{76}$ constructing the gate circuit 7, upon the commonly connected cathode electrode of the diodes $D_6$ and $D_9$ which are connected with the base of the feedback input transistor and which construct the gate circuit.

In the master latch circuits 3a and so on, therefore, when the clock pulses CP are at the high level, the diodes $D_1$ to $D_5$ are rendered non-conductive to impress their respective input signals upon the input transistors $Q_{63}$, $Q_{69}$ and so on, whereas the feedback input transistors $Q_{64}$, $Q_{70}$ and so on are rendered non-conductive in response to the low level of the clock pulses $\overline{CP}$ because the diodes $D_6$, $D_9$ and so on are rendered conductive. As a result, the transistors $Q_{66}$, $Q_{67}$ and so on constructing the inverter circuit are rendered conductive and non-conductive in accordance with the gray code signals, which are fed through the input transistor $Q_{63}$, thereby to receive the signals.

Next, since the diodes $D_1$ to $D_5$ are rendered conductive while the clock pulses CP are at the low level, the input transistors $Q_{63}$, $Q_{69}$ and so on are forcibly rendered non-conductive. On the contrary, since the clock pulses $\overline{CP}$ are at the high level, the diodes $D_6$, $D_9$ and so on are rendered non-conductive. As a result, when the transistor $Q_{67}$ constructing the inverter circuit of the subsequent stage is non-conductive in response to the aforementioned input signal, the feedback diode $D_8$ is rendered non-conductive whereas the feedback input transistor $Q_{64}$ is rendered conductive. Thus, the latching operation is made such that the transistor $Q_{66}$ constructing the inverter circuit of the previous stage is rendered conductive to render the aforementioned transistor $Q_{67}$ non-conductive. On the other hand, if the transistor $Q_{67}$ constructing the inverter circuit of the subsequent stage is conductive in response to the aforementioned input signal, the feedback diode $D_8$ is rendered conductive, whereas the feedback input transistor $Q_{64}$ is rendered non-conductive. As a result, the latching operation is made such that the transistor $Q_{66}$ constructing the inverter circuit of the previous stage is rendered non-conductive to render the aforementioned transistor $Q_{67}$ conductive.

In the underflow master latch circuit 6, incidentally, by the provision of the gate circuit 7, when the external terminal L is at 0 V, the diode $D_{11}$ is always rendered conductive to render non-conductive the transistor $Q_{74}$ constructing the inverter circuit of the subsequent stage so that the output is always at the low level irrespective of the detection of the underflow thereby to interrupt the underflow detecting function. The necessity for this function will be described later.

A code converting circuit 4 is constructed of a TTL circuit using multi-emitter transistors.

More specifically, multi-emitter transistors $Q_{78}$ to $Q_{85}$ and transistors $Q_{85}$ to $Q_{92}$ prepare the lowest bit signal $2^0$ of binary code in response to the gray code signals A and $\overline{A}$ to D and $\overline{D}$. Multi-emitter transistors $Q_{93}$ to $Q_{96}$ and transistors $Q_{97}$ to $Q_{100}$ prepare the second bit signal $2^1$ in response to the gray code signals B and $\overline{B}$ to D and $\overline{D}$. Multi-emitter transistors $Q_{101}$ and $Q_{102}$ and transistors $Q_{103}$ and $Q_{104}$ prepare the third bit signal $2^2$ in response to the gray code signals C and $\overline{C}$ to D and $\overline{D}$. Moreover, a multi-emitter transistor $Q_{105}$ and a transistor $Q_{106}$ transmit the gray code signal D as the highest bid signal $2^3$ of binary code.

The aforementioned multi-emitter transistors are fed with not only the aforemantioned gray code signals but also the gate signal CP' at their emitters which construct the gate input terminals.

When the external terminal L at 0 V or when the external terminal L is at $V_{CC}$ and no underflow detection is performed, the transistor $Q_{74}$ constructing the inverter circuit of the subsequent stage is non-conductive so that the clock pulses $\overline{CP}$ are fed out through the transistors $Q_{75}$ and $Q_{76}$. On the other hand, only while the clock pulses CP are at the high level, the gate signal CP' at the high level effects the code converting operation of the code converting circuit 4.

Moreover, in case the external terminal L is at $V_{CC}$ and during the underflow detection for $V_L > V_{IN}$, the transistors $Q_{69}$, $Q_{72}$ and $Q_{73}$ constructing the underflow master latch circuit 6 are rendered non-conductive, whereas the transistor $Q_{74}$ is rendered conductive so that a transistor $Q_{77}$ is rendered conductive to set the gate signal CP' at the low level. As a result, all of the multi-emitter transistors are forcibly rendered conductive to raise all the binary code conversion outputs to the high level.

A slave latch circuit 4a, which is made receptive of the lowest bit signal $2^0$ of binary code, is constructed of: a multi-emitter transistor $Q_{109}$; a feedback transistor $Q_{110}$ made receptive of the output of the former transistor; load resistors $R_{55}$ and $R_{56}$ connected with the collector and emitter of the feedback transistor, respectively; a transistor $Q_{111}$ made receptive of the collector output; load resistors $R_{57}$ and $R_{58}$ connected with the collector and emitter of the former transistor; and a transistor $Q_{112}$ made receptive of the emitter output for feeding back the inverted output through the multi-emitter transistor $Q_{109}$.

Incidentally, a transistor $Q_{113}$, which is made receptive of the emitter output of the transistor $Q_{110}$, is an output transistor thereby to construct an open collector output circuit having its collector connected with an external terminal Q.

The operations of that slave latch circuit 4a are performed such that when the clock pulses CP are at the low level the multi-emitter transistor $Q_{109}$ is forcibly rendered conductive to render the feedback transistor $Q_{110}$ non-conductive. As a result, the transistor $Q_{111}$ is rendered conductive and non-conductive in accordance with the code conversion output, thus performing the reception of the code conversion output. Moreover, when the clock pulses CP are at the high level, the ON/OFF outputs of the transistor $Q_{111}$ are positively fed back through the transistor $Q_{112}$, the multi-emitter transistor $Q_{109}$ and the transistor $Q_{110}$ thereby to effect the latching operations.

In the embodiment circuit thus far described, as a result, the operations of introducing the inputs into the master latch circuit are carried out during the former half period when the clock pulses CP are at the high level, while the operations of introducing the code-converted inputs into the slave latch circuits are carried out during the latter half period when the clock pulses CP are at the low level.

The reason why the data transfer is performed by the use of the clock pulses will be described in the following. For $V_{IN} \approx V_8$, for example, as shown in FIG. 7, the gray code D indicates an intermediate level to judge that, in the TTL circuits for the code converting operations, the circuits for preparing the $2^0$, $2^1$ and $2^2$ signals are at the high level whereas the circuit for preparing the $2^3$ signal is at the low level. Then, the erroneous operations of "0", "0", "0" and "0" as the binary code take place. Therefore, the sampling operation is performed by the master latch circuit at the aforementioned timings.

Incidentally, FIG. 7 shows the operation chart in case the external terminal L is at the $V_{CC}$ level. Upon the underflow detection, the outputs $2^0$ to $2^3$ are forcibly set at the high level. If the external terminal L is at 0 V, on the other hand, the underflow output and the outputs $2^0$ to $2^3$ do not vary, as indicated at broken lines in FIG. 7.

On the other hand, the concrete circuits of the other slave latch circuits 3b to 3d and 8 and their operations are similar to those of the slave latch circuit having been described in the above.

A bias circuit 10a constructs a bias circuit for driving constant current transistors which construct constant current circuits $I_{01}$ to $I_{016}$ disposed in the comparator. In order to prevent the erroneous operations due to noises, condensers are connected with the external terminals G and H thereby to reduce the impedance of the bias voltage output.

On the other hand, a bias circuit 10b is used to drive the constant current transistors which construct the constant current circuits $I_{017}$ to $I_{063}$ disposed in the level conversion circuit, the master latch circuit, the code conversion circuit, the slave latch circuit and so on.

The comparator in this embodiment circuit directly prepares the digital output signals A and $\overline{A}$ to D and $\overline{D}$ of gray code and of opposite phases.

As a result, the gray code signals of high gain can be generated with the use of a remarkably simple circuit including the differential transistor circuits for amplifying those outputs.

More specifically, in case the two-stage differential transistor circuits are used to construct the comparator, the prior art requires $2(2^n-1)$ differential transistor circuits and complex code conversion circuits when the digital signals of n bits are to be prepared. On the contrary, the embodiment circuit can remarkably simplify the circuit construction and reduce the power consumption as a result that it can be constructed of $(2^n-1)+n$ differential transistor circuits when the digital signals of n bits are to be prepared, that the number of the resistors can be reduced because many of the aforementioned $2^n-1$ differential transistors have their collectors commonly connected with each other and with the load resistors, and that the code conversion circuit can make use of the simple emitter-follower circuits.

Moreover, in case the digital outputs of gray code are to be generated, such a sampling as is employed to generate the digital outputs of binary code can be made unnecessary, and high-speed operations can be realized.

Needless to say, incidentally, it is also possible to reduce the chip size for fabrication of the monolithic IC and to enlarge the allowability for dispersion in the input threshold at the comparators.

The first invention thus far described should not be limited to the aforementioned embodiments but can dispense with the amplification stage circuits in case the steep switching characteristics are not required. Even in this case, there can be attained advantages that the circuit construction can be simplified, that the digital signals of predetermined code can be easily prepared, and that the chip size can be reduced for the fabrication of the monolithic IC.

On the other hand, to make the collectors common should not limited to that between the different comparators but can be conceived to be effected between two or more comparators. In this modification, the collector junction capacity is increased so that the switching speed is lowered. And, such modification is not required in case the aforementioned quasi-decimal code or gray code signals are to be generated.

Still moreover, the respective embodiment circuits can be modified such that the constant current sources are replaced by resistors, and the concrete circuit system and construction in the case of application to the A/D converter can be modified in various ways.

On the other hand, the A/D converter shown in FIGS. 6(A) and 6(B) can enjoy the following features because it has both the underflow detection output function and the function to forcibly set the output at a predetermined level in accordance with that detection output.

More specifically, since the A/D converter constructed as the monolithic or hybrid IC, as has been described in the above, has its circuit construction fixed, it is inconvenient to extend the output bits. Nevertheless, the A/D converter in this embodiment circuit can perform the output extension with remarkable ease.

Figure 8:
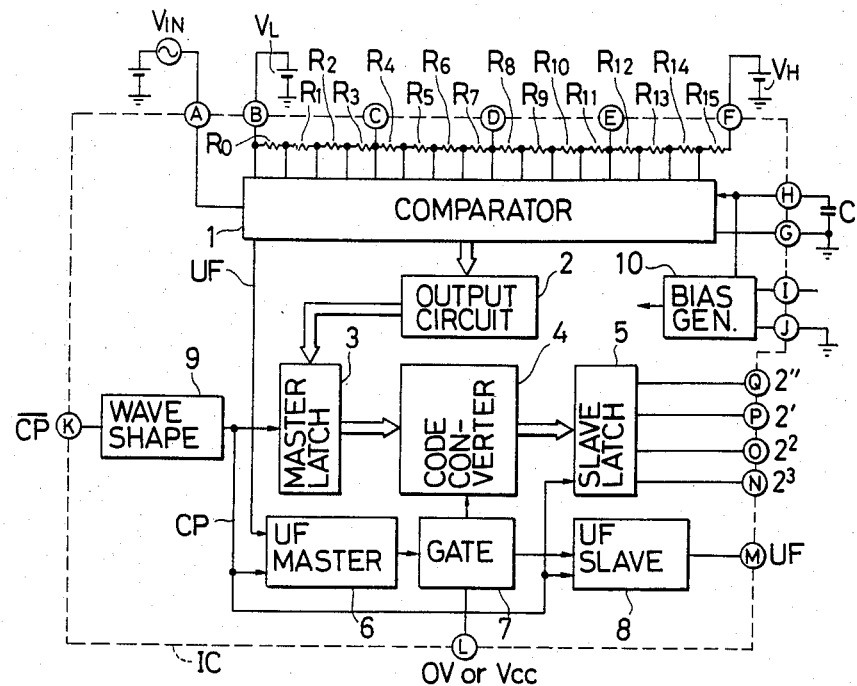
FIG. 8 is a block diagram showing an A/D converter according a further embodiment of the present invention.

FIG. 8 is a block diagram showing the A/D converter according to one embodiment of the second invention, and the parts enclosed broken lines IC are constructed into either a monolithic semiconductor integrated circuit or a hybrid integrated circuit. Alphabetical letters enclosed by circles indicate the names of the terminals of the integrated circuit.

Numeral 1 indicates a comparator which is operative to compare the reference voltages prepared by uniformly dividing the lowest voltage $V_L$ impressed upon the terminal B and the highest voltage $V_H$ impressed upon the terminal F by means of the series resistors $R_0$ to $R_{16}$ with the analog voltage signal $V_{IN}$ fed from the terminal A. This comparator is equipped with an underflow detecting comparator for detecting the analog input signal $V_{IN}$ lower than the lowest voltage $V_L$.

Numeral 2 indicates an output circuit for feeding out the output of the comparator 1 as the digital signal of gray code.

Numeral 3 indicates a master latch circuit for receiving the digital signals of gray code from the output circuit 2 in synchronism with a first timing.

Numeral 4 indicates a code conversion circuit for converting the digital signals of gray code received by the master latch circuit 3 into digital signals of binary code.

Numeral 5 indicates a slave latch circuit for receiving the digital signals of binary code converted by the code conversion circuit 4 in synchronism with a second timing.

Numeral 6 indicates an underflow master latch circuit for receiving the underflow detection signals UF of the comparator 1 in synchronism with the first timing.

Numeral 7 indicates a gate circuit for controlling whether or not the underflow signal from the master latch circuit 6 is to be transmitted to the slave latch circuit 8 at the output side in accordance with the control signal (at 0 V or $V_{CC}$) from the terminal L and whether or not the output binary code to be performed at the code conversion circuit 4 is forcibly fixed in accordance with the underflow signal.

The aforementioned slave latch circuit 8 receives the underflow signal in synchronism with the second timing and feeds the underflow signal UF out of the terminal M.

Numeral 9 indicates a circuit for shaping the waveforms of the clock pulses $\overline{CP}$ fed from the terminal K thereby to impress the inverted clock pulses CP upon the master latch circuits 3 and 6 and the slave latch circuits 5 and 8. The master latch circuits 3 and 6 receive the input signals by using the former half period of the clock pulses as the first timing, whereas the slave latch circuits 5 and 8 receive the input signals by using the latter half period of the clock pulses as the second timing.

Numeral 10 indicates a bias circuit for preparing the bias voltage which drives the constant current transistors constructing the comparator 1, the output circuit 2, the latch circuits, the conversion circuit 4 and so on.

A condenser C connected between terminals H and G is used to stabilize the bias voltage.

Incidentally, the terminals C, D and E, which are connected with the respective intermediate points between the series resistors for preparing the reference voltages of the comparator 1, are used to measure whether or not the reference voltages are accurately prepared, and may be dispensed with.

Figure 9A:
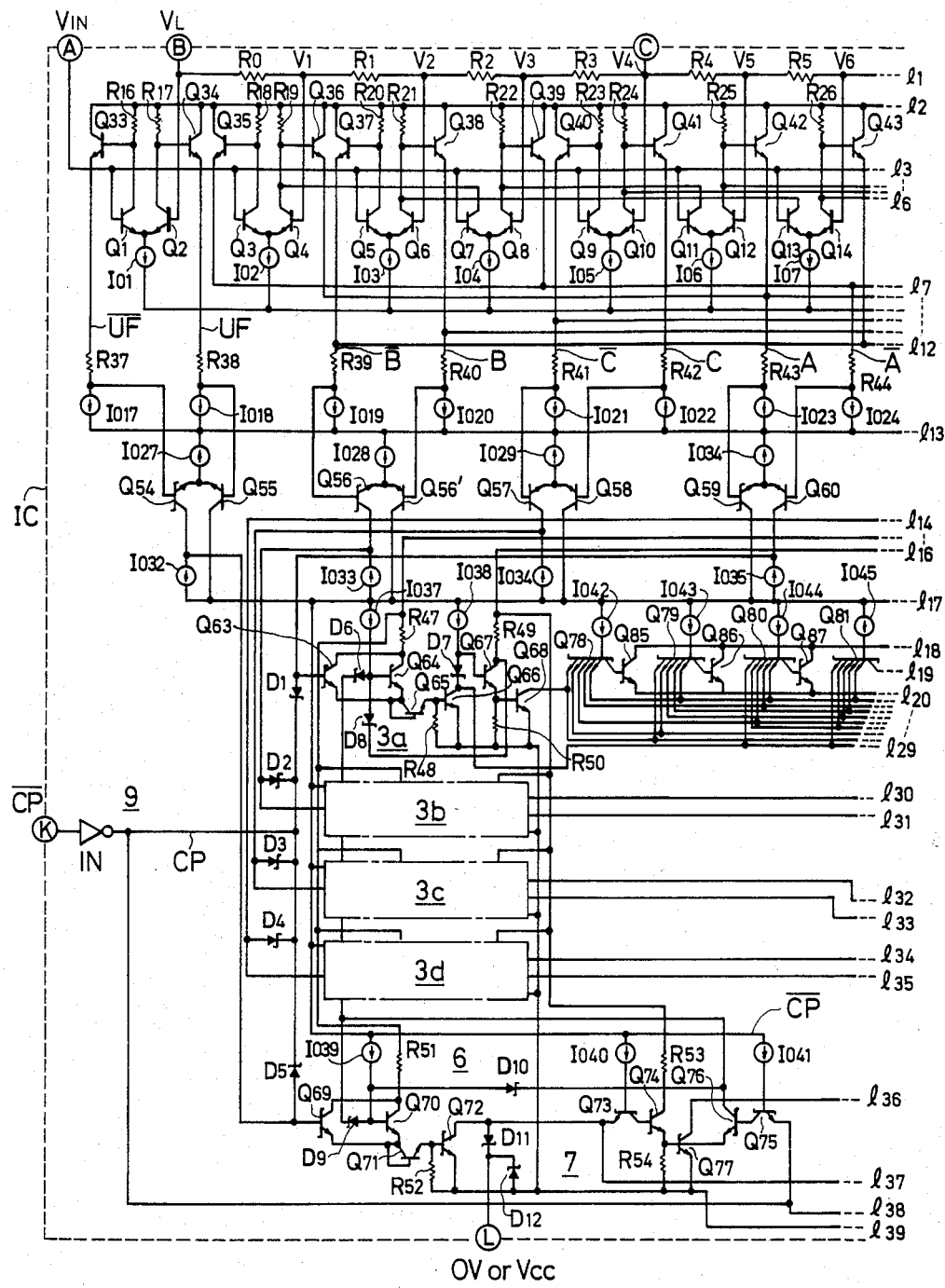
FIGS. 9(A) and 9(B) are a circuit diagram showing an A/D converter according to a further embodiment of the present invention.

FIGS. 9(A) and (B) are a concrete circuit diagram showing a four-bit A/D converter according to one embodiment of the second invention. The parts enclosed by broken lines IC are formed in the monolithic IC, and the circuit block numbers and the terminal symbols are made to correspond to those of the embodiment of FIG. 1.

Figure 9B:
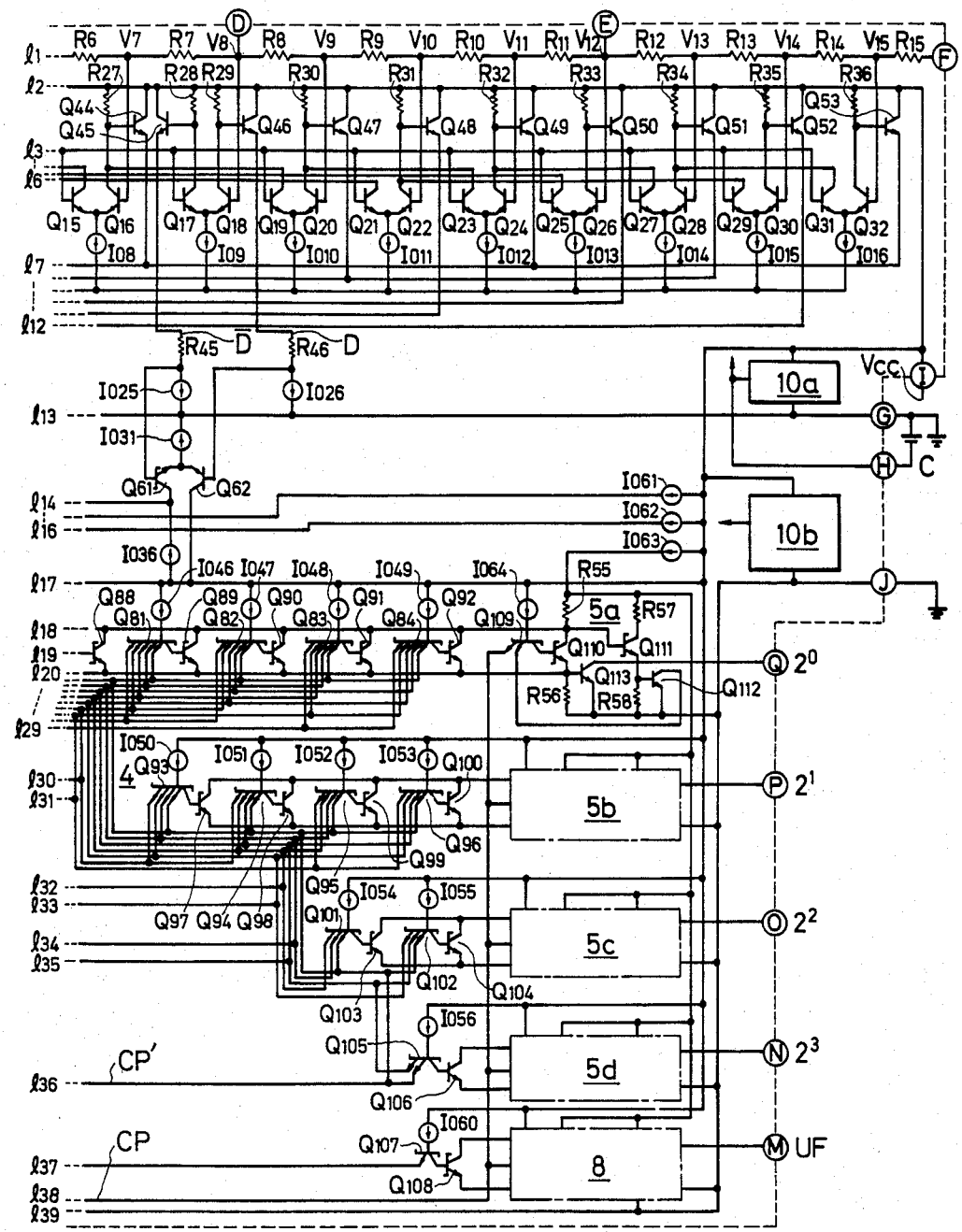

The construction and operations of the circuit shown in FIGS. 9(A) and 9(B) are almost the same as those of the circuit having already been described with reference to FIGS. 6(A) and 6(B), and their detailed explanations are omitted here.

Figure 10:
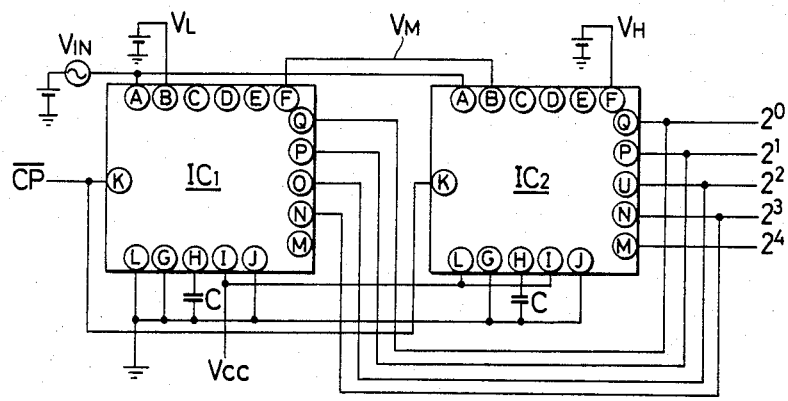
FIG. 10 shows an output extending system using the A/D converters according to the embodiment of the present invention.

FIG. 10 is a block diagram showing one embodiment of an output extending system of the A/D converter according to the second invention.

Letters $IC_1$ and $IC_2$ indicate A/D converters having the same construction as the aforementioned one.

The external terminal B of the A/D converter $IC_1$ is fed with the lowest voltage $V_L$. The external terminal F, which is the highest voltage terminal of the A/D converter $IC_1$, is connected with the external terminal B which is the lowest voltage terminal of the other A/D converter $IC_2$. The external terminal F of the A/D converter $IC_2$ is fed with the highest voltage $V_H$. As a result, the internal reference voltages of the A/D converters $IC_1$ and $IC_2$ are divided by thirty-two into respective voltages, an intermediate voltage $V_M$ is prepared at the connecting terminals F and B.

Therefore, the A/D converter $IC_1$ takes its share in the voltage range $V_L$ to $V_M$, whereas the A/D converter $IC_2$ takes its share in the voltage range $V_M$ to $V_H$.

The analog input voltage $V_{IN}$ is commonly fed to the external terminals A of the A/D converters $IC_1$ and $IC_2$.

On the other hand, the clock pulses $\overline{CP}$ are commonly fed to the external terminals K of the A/D converters $IC_1$ and $IC_2$.

The output terminals Q to N of the A/D converters $IC_1$ and $IC_2$ are commonly connected with their partners and with load resistors, respectively. In short, a wired OR circuit is constructed.

The external terminal L of the A/D converter $IC_1$ is fed with 0 V so that the underflow detecting operation is prohibited.

On the other hand, the external terminal L of the A/D converter $IC_2$ is fed with $V_{CC}$ so that the underflow detecting operations is performed.

On the other hand, the external terminals I of the A/D converters $IC_1$ and $IC_2$ are fed with the power source voltage $V_{CC}$, whereas the external terminals G and J of the same are grounded to the earth. Moreover, the external terminals H are connected with condensers C, respectively.

The underflow signal, which is fed out of the external terminal M of the converter $IC_2$ of the A/D converters $IC_1$ and $IC_2$ having the aforementioned construction, is used as an extension bit signal $2^4$.

In this embodiment circuit, for the analog voltage $V_{IN}$ within a range $V_L > V_{IN} > V_M$, the underflow detection circuit of the A/D converter $IC_2$ operates to lower its detected output UF to the low level, as shown in FIG. 7, and to raise the outputs $2^0$ to $2^3$ to the high level.

As a result, the output by the wired OR has its level depending upon the outputs $2^0$ to $2^3$ of the A/D converter $IC_1$, and the underflow output UF at the aforementioned low level is generated as the output $2^4$ so that the output signals $2^0$ to $2^4$ of extended binary code can be generated.

For the analog voltage $V_{IN}$ within a range $V_M > V_{IN} > V_H$, on the other hand, the outputs $2^0$ to $2^3$ of the A/D converter $IC_1$ automatically take the high level, as shown in FIG. 7, whereas the outputs $2^0$ to $2^3$ by the wired OR are released from the forced high level of the output as the result of the aforementioned underflow detection so that the level depending upon the outputs $2^0$ to $2^3$ of the A/D converter $IC_2$ is fed out. On the other hand, the underflow output of the A/D converter $IC_2$ is varied at the high level, as shown in FIG. 7, so that the extended binary code output signals $2^0$ to $2^4$ can be generated.

Incidentally, the reason why the underflow detecting operation of the A/D converter $IC_1$ is prohibited will be described in the following. In case the lower voltage range is shared (or in case the A/D converter $IC_1$ is used as a single A/D converter), as has been described hereinbefore, the forced setting of the outputs $2^0$ to $2^3$ at the high level for $V_{IN} < V_L$ would invite the erroneous operation that the outputs become "1", "1", "1" and "1" for the $V_{IN} < V_L$.

Figure 11:
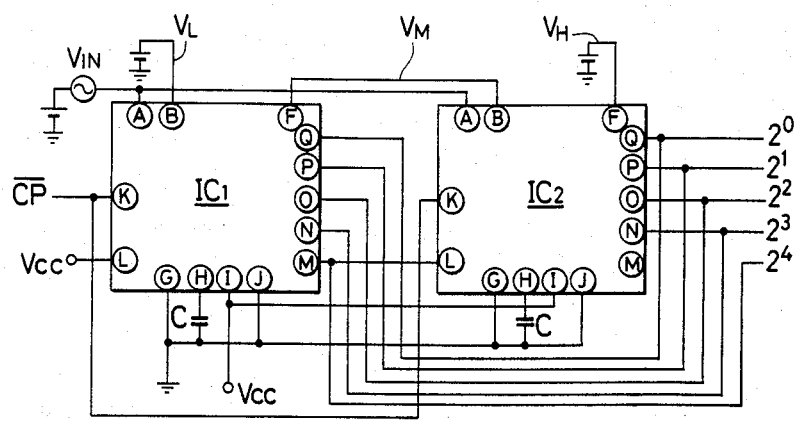
FIG. 11 shows an output extending system using the A/D converters according to the other embodiment of the present invention.

FIG. 11 is a block diagram showing another embodiment of the present invention. The A/D converters $IC_1$ and $IC_2$ in this embodiment are made to have the function to forcibly raise the outputs $2^0$ to $2^4$ from the overflow detecting output circuit and the external terminals L to the high level.

For example, the overflow detecting output circuit feeds the high level out of the external terminals M during the overflow and is constructed by equipping the embodiment circuit of FIGS. 9(A) and 9(B) with the comparator, which uses the voltage at the terminals F as the reference voltage, and master and slave latch circuits.

On the other hand, the external terminal L prohibits the operations of the code conversion circuit of the embodiment circuit of FIGS. 9(A) and 9(B), for example, when it is at the low level, thereby to forcibly raise the outputs $2^0$ to $2^3$ to the high level.

The A/D converters $IC_1$ and $IC_2$ thus constructed are connected in a similar manner to the aforementioned one. Incidentally, the overflow output terminal M of the A/D converter $IC_1$ is connected with the external terminal L of another A/D converter $IC_2$ so that the overflow output of the A/D converter $IC_1$ is used at the extension bit signal $2^4$. On the other hand, the external terminal L of the A/D converter $IC_1$ is fixed at the high level thereby to prohibit the forced high level operations of the outputs $2^0$ to $2^3$.

In this embodiment circuit, if the analog voltage $V_{IN}$ is lower than $V_M$, the overflow output of the A/D converter $IC_1$ is at the low level thereby to set the extension output bit signal $2^4$ at the low level and the external terminal L of the A/D converter $IC_2$ at the low level so that the outputs $2^0$ to $2^3$ of the A/D converter $IC_2$ are forcibly raised to the high level.

As a result, the outputs $2^0$ to $2^3$ by the wired AND are set at the level depending upon the outputs $2^0$ to $2^3$ of the A/D converter $IC_1$ similarly to the aforementioned one so that the extended binary code signals $2^0$ to $2^4$ can be generated.

When the analog voltage $V_{IN}$ is expressed by an inequality $V_M > V_{IN} > V_H$, on the other hand, the outputs $2^0$ to $2^3$ of the A/D converter $IC_1$ are automatically raised to the high level, and the overflow output is raised to the high level. As a result, the forced output high level of the A/D converter $IC_2$ is released to effect the A/D conversion.

As a result, the outputs $2^0$ to $2^3$ by the wired AND are set at the level depending upon the outputs $2^0$ to $2^3$ of an A/D converter $IC_2$ similarly to the aforementioned one so that the extended binary code signals $2^0$ to $2^4$ can be generated together with the aforementioned overflow outputs at the high level.

Figure 12:
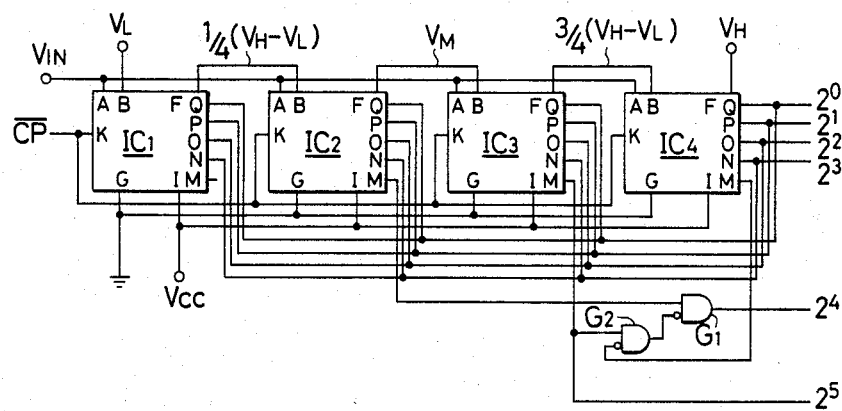
FIG. 12 shows another output extending system using the A/D converters according to the embodiment of the present invention.

FIG. 12 is a block diagram showing another embodiment of the present invention.

This embodiment corresponds to the case, in which the extensions of four times are performed by the use of the four A/D converters $IC_1$ to $IC_4$ shown in FIGS. 9(A) and 9(B).

The connecting method of the A/D converters $IC_1$ and $IC_2$ in this embodiment is basically similar to that of the foregoing embodiment, and its repeated explanation is omitted here.

Here, in order to prepare the extended output signals $2^4$ and $2^5$, the underflow signals of the A/D converters $IC_2$, $IC_3$ and $IC_4$ are consecutively raised to the high level such that $V_{IN} > \frac{1}{4}(V_H - V_L)$, $V_{IN} > V_M$ and $V_{IN} > \frac{3}{4}(V_H - V_L)$ so that the extended output $2^4$ is prepared by gate circuits $G_1$ and $G_2$, for example, as shown in the same Figure. As the extended output $2^5$, on the other hand, the underflow output of the A/D converter $IC_3$, which is at the high level for $V_{IN} > V_M$, can be utilized as it is.

The aforementioned gate circuits $G_1$ and $G_2$ raise the output $2^4$ to the high level for $\frac{1}{4}(V_H - V_L) < V_{IN} < V_M$ because the output of the A/D converter $IC_2$ is at the high level (i.e., "1") whereas the others are at the low level (i.e., "0"). Next, for $V_M < V_{IN} < \frac{3}{4}(V_H - V_L)$, the output $2^4$ is lowered to the low level because the outputs of the A/D converters $IC_2$ and $IC_3$ are at the high level whereas the others are at the low level.

For $V_{IN} > \frac{3}{4}(V_H - V_L)$, moreover, all the outputs of the A/D converters $IC_2$ to $IC_4$ are at the high level so that the output $2^4$ can be raised again to the high level.

As a result, the extended binary code signals $2^0$ to $2^5$ can be generated.

As has been described hereinbefore, the A/D converters constructed as integrated circuit devices are made to additionally have the underflow detecting output function and the function to forcibly set the outputs to a predetermined level in accordance with the underflow detection signals, or the overflow detecting output function and the function to forcibly set the outputs to a predetermined level in accordance with the signals from the external terminals, whereby the output bits can be easily extended. Especially, in case the output circuits are constructed of the open-collector transistors and are forcibly turned off in accordance with the aforementioned underflow detection signals or the signals from the outside thereby to use the high level (i.e., the positive power source voltage), the output bits can be extended by the use of the remarkably simple construction because the wired AND can be utilized.

Moreover, since the A/D converters according to the present invention have the underflow or overflow detecting output function, it can be used, too, for controlling the gain or d.c. voltage of a composite video signal amplifying circuit as the input analog signal source, in case the composite video signal in television broadcasting operation is subjected to the A/D conversion, such that the voltage level of a synchronizing signal may become coincident with the underflow or overflow detection output which is prepared by that A/D conversion.

Moreover, the A/D converter according to the present invention can have their differential and multi-emitter transistors formed in an identical device forming region when they are to be monolithically integrated, as shown in the embodiment of FIGS. 9(A) and 9(B), because the differential transistors as the comparator have their collectors commonly connected and because the multi-emitter transistors are used as the code convertion circuit.

As a result, a highly dense integration can be realized.

Still moreover, since the analog signals are converted by the compartor into the digital signals of gray code, the error at a switching intermediate point of the comparator is as small as $\pm 1$ bit, and the sampling is not required, as is different from the case in which the digital signals of binary code are to be directly prepared. As is apparent from FIG. 7, furthermore, the input threshold of the comparator becomes the alternate reference voltages under the lowest bit so that the allowability for dispersion can be enlarged. Furthermore, the frequency characteristics can be extended to twice frequency range as high as the case in which the digital signals of binary code are to be directly generated.

Furthermore, since the aforementioned comparators can prepare the signals $\overline{A}$ to $\overline{D}$ in opposite phases to those of the signals A to D in positive phase as the digital signals of gray code, it is possible to attain a large gain with the use of the simple circuit by amplifying the signals of opposite phases by means of the differential amplifying circuits.

Furthermore, upon the output extension, as shown in FIGS. 10 or 11, since no logic means is incorporated upon the interchange between the A/D converter for taking its share in the lower voltage range and the A/D converter for taking its share in the higher voltage range, there arises no erroneous operation, and the high-speed operation can be realized.

The present invention should not be limited to the embodiments thus far described but can take a variety of modes of embodiments.

The A/D converters may be constructed of hybrid ICs. On the other hand, the outputs of the comparators may be directly converted into the digital signals of binary code and may be fed out.

On the other hand, the output circuit may be constructed of the open-emitter transistors. In this modification, a wired OR may be used for the output extension. In this case in which the wired OR is used, it is convenient to forcibly render the output transistor non-conductive in accordance with the overflow detection signal thereby to effect the low level.

Furthermore, the output circuit may be constructed of the TTL circuit and so on. In this case, it is necessary to provide an AND or OR circuit for the output extension.

Furthermore, the concrete circuit construction of the A/D converter can be modified in various ways.

What is claimed is:

1. An integrated A/D converter comprising:
   (1) comparator means for comparing a plurality of different reference voltages individually to an analog input signal and for producing a plurality of output signals as a result of said comparisons;
   (2) code converter means connected to said comparator means for converting the plural output signals of said comparator means into digital signals of plural bits;
   (3) critical detecting means for comparing a critical reference voltage having a level outside of the range of said plural reference voltages with the analog input signal and for producing a detection output at a predetermined level in case said analog input signal exceeds said critical reference voltage;
   (4) control means responsive to external control for selectively forcibly controlling the levels of said digital signals of the plural bits to a selected level in case said detected output of said critical detecting means reaches said predetermined level;
   (5) first output means for feeding out said digital signals of the plural bits of said code converter means to the plural output terminals of an integrated circuit; and
   (6) second output means for feeding out the detected output of said critical detecting means to another output terminal of said integrated circuit, wherein said control means includes a control input terminal which is provided as an external terminal of said integrated circuit and means for inhibiting the forced control operation by impressing a control signal upon the control input terminal of said control means.

2. An integrated A/D converter comprising:
   (1) comparator means for comparing a plurality of different reference voltages and an analog input signal;
   (2) code converter means connected to said comparator means for converting the plural output signals of said comparator means into digital signals of plural bits;
   (3) critical detecting means for comparing the critical reference voltage having a level outside of the range of said plural reference voltages with the analog input signal thereby to feed out a detection output at a predetermined level in case said analog input signal exceeds said critical reference voltage;
   (4) control means responsive to external control for selectively forcibly controlling the levels of said digital signals of the plural bits to a selected level in case said detected output of said critical detecting means reaches said predetermined level;
   (5) first output means for feeding out said digital signals of the plural bits of said code converter means to the plural output terminals of an integrated circuit; and
   (6) second output means for feeding out the detected output of said critical detecting means to another output terminal of said integrated circuit, wherein said control means includes a control input terminal which is provided as an external terminal of said integrated circuit and means for inhibiting the forced control operation by impressing a control signal upon the control input terminal of said control means;
   wherein said comparator means comprises a plurality of comparator stages each including first and second transistors differentially connected; means for connecting the bases of said first transistors in each stage in common to receive an analog input signal; and means for connecting the bases of said second transistors in each stage to receive a respective one of a plurality of successively-increasing levels of reference voltage, the collector of the second transistors of the $(n-x)$th stage and the collector of the first transistor of the nth stage being commonly connected, where n and x are non-zero integers and $(n+1)$ equal the number of comparator stages; and load means for connecting the collectors of said first and second transistors in said plurality of comparator stages to a source of supply voltage.

3. An integrated A/D converter according to claim 1, wherein said comparator means includes:
   (1) a first input terminal forming an external terminal of said integrated circuit;
   (2) a second input terminal forming an external terminal of said integrated circuit;
   (3) a plurality of voltage dividing resistors connected in series between said first input terminal and said second input terminal for generating said plural reference voltages at the common connecting points thereamong; and
   (4) a third input terminal forming an external terminal of said integrated circuit for receipt of said analog input signal.

4. An A/D converting system comprising:
   (1) first and second converter circuits each comprising comparator means for comparing a plurality of different reference voltages and an analog input signal, including a plurality of voltage dividing resistors connected in series between first and second terminals for generating said plural reference voltages and a third terminal for receipt of said analog input signal; code converter means for converting the plural output signals of said comparator means into digital signals of plural bits; critical detecting means for comparing the critical reference voltage having a level outside of the range of said plural reference voltages with the analog input signal thereby to feed out a detection output at a predetermined level in case said analog input signal exceeds said critical reference voltage; control means for forcibly controlling the levels of said digital signals of the plural bits in case said detected output of said critical detecting means reaches said predetermined level; first output means for feeding out said digital signals of the plural bits of said code converter means to plural output terminals; and second output means for feeding out the detected output of said critical detecting means to another output terminal, said first converter circuit being formed in a first integrated circuit and said second converter circuit being formed in a second integrated circuit;

(2) means for connecting said first terminal of said first converter circuit with a first potential point;

(3) means for connecting said second terminal of said first converter circuit with said first terminal of said second converter circuit;

(4) means for connecting said second terminal of said second converter circuit with a second potential point;

(5) means for impressing an analog signal upon said third terminal of said first converter circuit and upon said third terminal of said second converter circuit; and (6) means for commonly connecting said plural output terminals of said first converter circuit and said plural output terminals of said second converter circuit.

5. An A/D converting system according to claim 4, wherein said control means in each of said first and second converter circuits includes a control input terminal which is provided as the external terminal of said integrated circuit out of said integrated circuit so that the forced control operation is prohibited by impressing a control signal upon the control input terminal of said control means.

6. An A/D converting system according to claim 5, further comprising:

means for feeding said control signal to a selected one of said control input terminals of said first and second converter circuits.

7. An A/D converting system according to claim 5, further comprising:

means for connecting said another output terminal of said first converter circuit and said control input terminal of said second converter circuit.

* * * * *